US011063116B2

(12) United States Patent
Yoshino

(10) Patent No.: US 11,063,116 B2
(45) Date of Patent: Jul. 13, 2021

(54) SEMICONDUCTOR DEVICE

(71) Applicant: Mitsubishi Electric Corporation, Tokyo (JP)

(72) Inventor: Manabu Yoshino, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 29 days.

(21) Appl. No.: 16/096,168

(22) PCT Filed: Sep. 13, 2016

(86) PCT No.: PCT/JP2016/076978
§ 371 (c)(1),
(2) Date: Oct. 24, 2018

(87) PCT Pub. No.: WO2018/051412
PCT Pub. Date: Mar. 22, 2018

(65) Prior Publication Data
US 2020/0203474 A1     Jun. 25, 2020

(51) Int. Cl.
*H01L 29/06*     (2006.01)
*H01L 27/06*     (2006.01)
*H01L 29/40*     (2006.01)

(52) U.S. Cl.
CPC ........ *H01L 29/063* (2013.01); *H01L 27/0617* (2013.01); *H01L 29/407* (2013.01)

(58) Field of Classification Search
CPC ............................ H01L 29/063; H01L 29/407
See application file for complete search history.

(56) References Cited

U.S. PATENT DOCUMENTS

| 4,292,642 A | 9/1981 | Appels et al. |
| 5,894,156 A | 4/1999 | Terashima et al. |
| 2005/0194656 A1 | 9/2005 | Shimizu |

(Continued)

FOREIGN PATENT DOCUMENTS

| JP | 2002-118230 A | 4/2002 |
| JP | 2005-251903 A | 9/2005 |

(Continued)

OTHER PUBLICATIONS

International Search Report issued in PCT/JP2016/076978; dated Dec. 13, 2016.

(Continued)

*Primary Examiner* — Jay C Chang
*Assistant Examiner* — Mikka Liu
(74) *Attorney, Agent, or Firm* — Studebaker & Brackett PC

(57) ABSTRACT

A RESURF isolation structure surrounds an outer periphery of the high-side circuit region to isolate the high-side circuit region and the low-side circuit region from each other. The RESURF isolation structure includes a high-voltage isolation region, a high-voltage N-ch MOS, and a high-voltage P-ch MOS. The high-voltage isolation region, the high-voltage N-ch MOS, and the high-voltage P-ch MOS include a plurality of field plates (9,19a,19b,19c). An inner end of the field plate (19c) of the high-voltage P-ch MOS located closest to the low-side circuit region is positioned closer to the low-side circuit region than an inner end of the field plate (19b) of the high-voltage N-ch MOS located closest to the low-side circuit region.

6 Claims, 16 Drawing Sheets

(56) References Cited

U.S. PATENT DOCUMENTS

2015/0255454 A1* 9/2015 Jonishi .................... H01L 28/20
257/338
2016/0300912 A1* 10/2016 Tanaka ................ H01L 27/0802

FOREIGN PATENT DOCUMENTS

JP          3917211 B2    5/2007
JP       2015-170733 A    9/2015

OTHER PUBLICATIONS

Written Opinion issued in PCT/JP2016/076978; dated Dec. 13, 2016.
Notification of Transmittal of the International Search Report and the Written Opinion of the International Searching Authority, or the Declaration issued in PCT/JP2016/076978; dated Dec. 13, 2016.
T.Terashima et al.; "Structure of 600V IC and a New Voltage Sensing Device"; 5th International Symposium on Power Semiconductor Devices & IC's: ISPSD '93; May 18-20, 1993; pp. 224-229; Monterey, California, USA.
Kazuhiro Shimizu et al.; "The 2nd Generation divided RESURF structure for High Voltage ICs"; Proceedings of the 20th International Symposium on Power Semiconductor Devices & IC's; May 18-22, 2008; pp. 311-314; Orlando, Florida, USA.

* cited by examiner

SEMICONDUCTOR DEVICE

FIELD

The present invention relates to a semiconductor device including a lateral high-voltage device.

BACKGROUND

An HVIC (High Voltage IC) that drives a power chip in a half bridge configuration includes a low-side circuit region, a high-side circuit region, and a level shift circuit for signal transmission between the low side and the high side. Substrate potential is set as the reference voltage in the low-side circuit region, while the high-side circuit region is isolated from the substrate to have a high breakdown voltage. High-voltage isolation of the high-side circuit region from the substrate voltage is achieved by the RESURF effect. In plan view, the outer periphery of the high-side circuit region is surrounded by a RESURF isolation structure (see, for example, PTL 1).

The level shift circuit includes a high-voltage N-ch MOS that transmits signals from the low-side circuit region to the high-side circuit region, and a high-voltage P-ch MOS that transmits signals from the high-side circuit region to the low-side circuit region. The high-voltage N-ch MOS and the high-voltage P-ch MOS have a breakdown voltage equal to that of the RESURF isolation region surrounding the outer periphery of the high-side circuit region (see, for example, NPL 1), and are formed within the same RESURF isolation region surrounding the outer periphery of the high-side circuit region (see, for example, PTL 2 and NPL 2).

CITATION LIST

Patent Literature

[PTL 1] U.S. Pat. No. 4,292,642 (Specification)
[PTL 2] Japanese Patent No. 3917211

Non Patent Literature

[NPL 1] T. Terashima, M. Yoshizawa, M. Fukunaga and G. Majumdar, "Structure of 600 V IC and A New Voltage Sensing Device", 5th International Symposium on Power Semiconductor Devices & IC's
[NPL 2] Kazuhiro Shimizu and Tomohide Terashima, "The 2nd Generation divided RESURF structure for High Voltage ICs" Proceedings of the 20th International Symposium on Power Semiconductor Devices & IC's May 18-22, 2008 Orlando, Fla.

SUMMARY

Technical Problem

The high-voltage N-ch MOS maintains the high breakdown voltage by full depletion of an N-type RESURF region. The high-voltage P-ch MOS maintains the high breakdown voltage by full depletion of a P-type diffusion layer on the surface in addition to the N-type RESURF region. Therefore, in both of the high-voltage N-ch MOS and high-voltage P-ch MOS, a transient leakage current flows during a period in which the depletion layer spreads within the high-voltage isolation region, from a time point when a high voltage is applied until full depletion is achieved. A prolonged period of this transient leakage current flow could induce a malfunction of the level shift circuit.

While a long field plate on the low side would accelerate depletion in the high-voltage N-ch MOS and shorten the period of transient leakage current flow, it would inhibit depletion of the P-type diffusion layer of the high-voltage P-ch MOS and prolong the period of transient leakage current flow. This can easily cause the high-voltage P-ch MOS of the level shift circuit to malfunction. On the other hand, a short field plate on the low side would cause the high-voltage N-ch MOS of the level shift circuit to malfunction easily. According to conventional techniques, the high-voltage N-ch MOS and high-voltage P-ch MOS have the same field plate structure, so that it was not possible to shorten the period of leakage current flow in both of the high-voltage N-ch MOS and high-voltage P-ch MOS.

The present invention was made to solve the problem described above and it is an object of the invention to provide a semiconductor device configured to shorten the period of transient leakage current that flows when high voltage is applied in both of a high-voltage N-ch MOS and a high-voltage P-ch MOS, to improve the malfunction tolerance of a level shift circuit.

Solution to Problem

A semiconductor device according to the present invention includes: a high-side circuit region; a low-side circuit region; and a RESURF isolation structure surrounding an outer periphery of the high-side circuit region to isolate the high-side circuit region and the low-side circuit region from each other, wherein the RESURF isolation structure includes a high-voltage isolation region, a high-voltage N-ch MOS, and a high-voltage P-ch MOS, the high-voltage isolation region, the high-voltage N-ch MOS, and the high-voltage P-ch MOS include a thermal oxide film, and a plurality of field plates provided on the thermal oxide film, an inner end of the field plate of the high-voltage P-ch MOS located closest to the low-side circuit region is positioned closer to the low-side circuit region than an inner end of the field plate of the high-voltage N-ch MOS located closest to the low-side circuit region.

Advantageous Effects of Invention

In the present invention, an inner end of the field plate of the high-voltage P-ch MOS located closest to the low-side circuit region is positioned closer to the low-side circuit region than an inner end of the field plate of the high-voltage N-ch MOS located closest to the low-side circuit region. Thus, the period in which a transient leakage current flows when a high voltage is applied is shortened in both of the high-voltage N-ch MOS and high-voltage P-ch MOS, whereby the malfunction tolerance of the level shift circuit can be improved.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
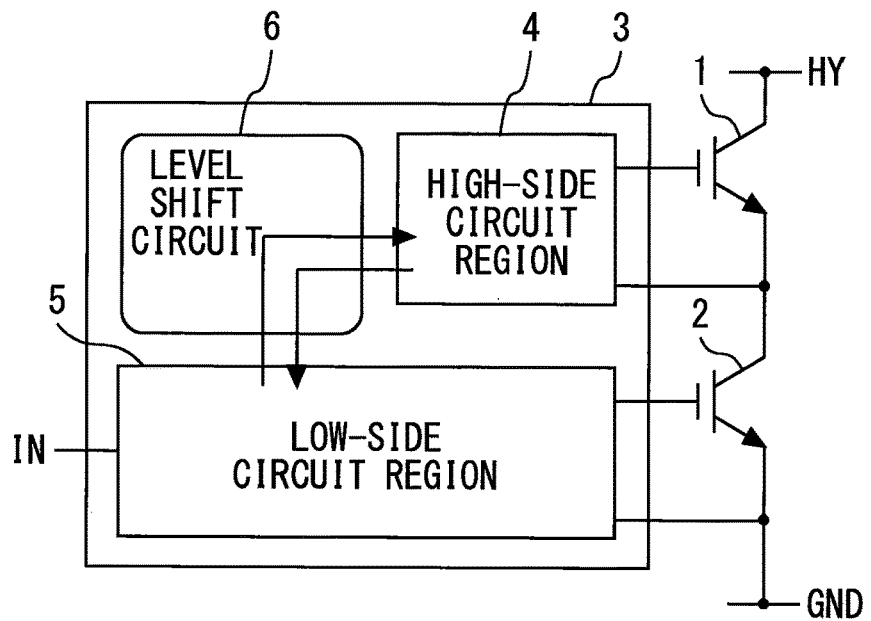
FIG. 1 is a diagram illustrating a semiconductor device according to Embodiment 1 of the present invention.

FIG. 1 is a diagram illustrating a semiconductor device according to Embodiment 1 of the present invention. This semiconductor device is an HVIC (High Voltage IC) 3 that drives power chips 1 and 2 in a half bridge configuration. The HVIC 3 includes a high-side circuit region 4 that drives the power chip 1, a low-side circuit region 5 that drives the power chip 2, and a level shift circuit 6 that transmits signals between the low-side circuit region 5 and the high-side circuit region 4.

Figure 2:
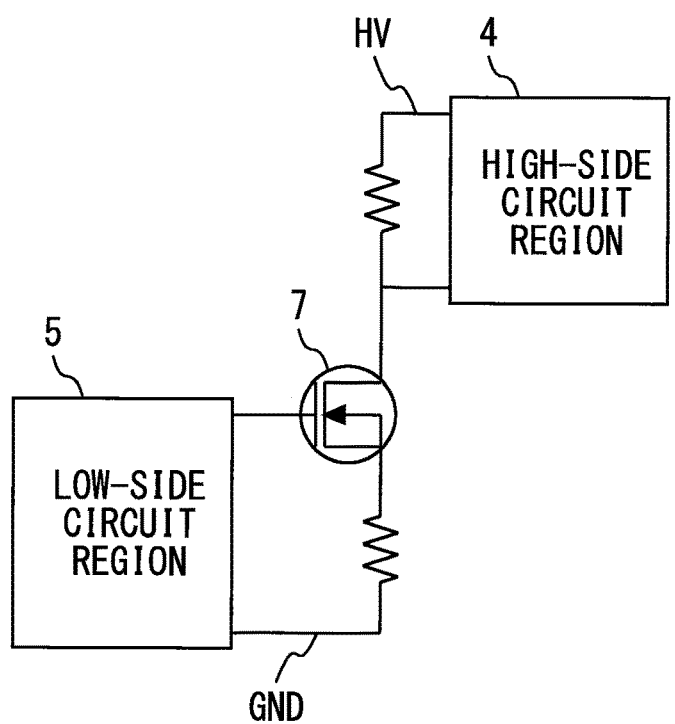
FIG. 2 is a diagram illustrating a high-voltage N-ch MOS in the level shift circuit according to Embodiment 1 of the present invention.
Figure 3:
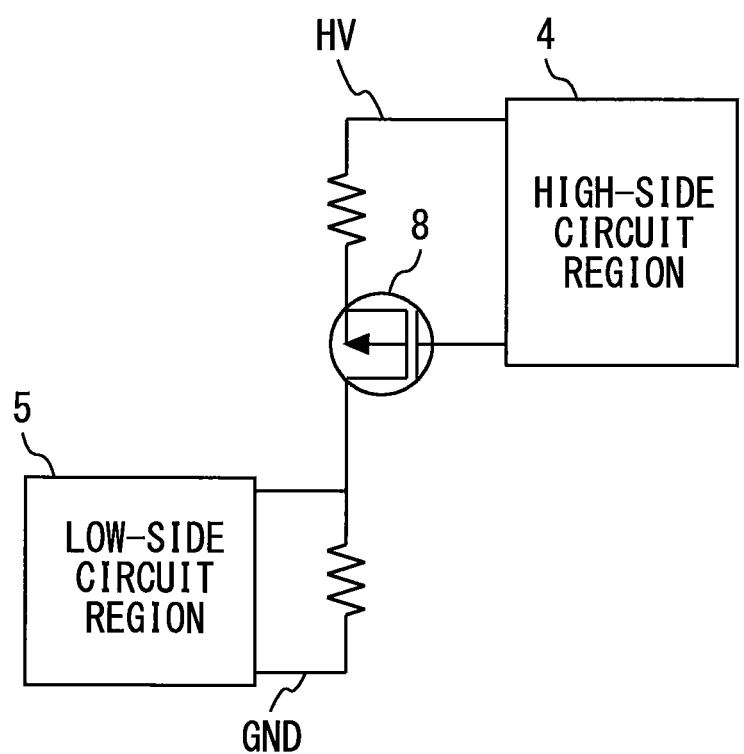
FIG. 3 is a diagram illustrating a high-voltage P-ch MOS in the level shift circuit according to Embodiment 1 of the present invention.

FIG. 2 is a diagram illustrating a high-voltage N-ch MOS in the level shift circuit according to Embodiment 1 of the present invention. The signal transmission from the low-side circuit region 5 to the high-side circuit region 4 is performed by the high-voltage N-ch MOS 7 in the level shift circuit 6. FIG. 3 is a diagram illustrating a high-voltage P-ch MOS in the level shift circuit according to Embodiment 1 of the present invention. The signal transmission from the high-side circuit region 4 to the low-side circuit region 5 is performed by the high-voltage P-ch MOS 8 in the level shift circuit 6.

Figure 4:
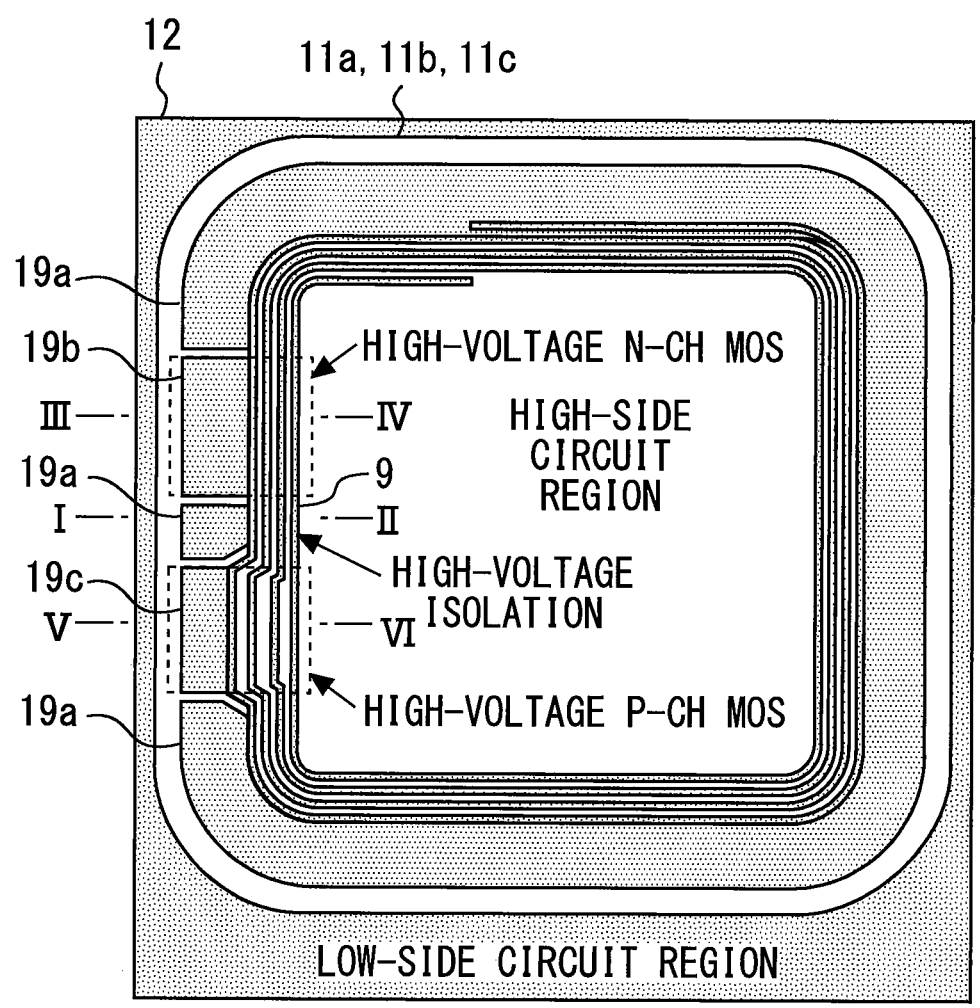
FIG. 4 is a plan view illustrating the high-side circuit region of the semiconductor device according to Embodiment 1 of the present invention.

FIG. 4 is a plan view illustrating the high-side circuit region of the semiconductor device according to Embodiment 1 of the present invention. For the sake of simplicity, only part of the configuration is shown. A RESURF isolation structure surrounds the outer periphery of the high-side circuit region in plan view to isolate the high-side circuit region and the low-side circuit region from each other. The RESURF isolation structure includes a high-voltage isolation region, a high-voltage N-ch MOS, and a high-voltage P-ch MOS. Substrate potential is set as the reference voltage of the low-side circuit region, while the high-voltage isolation region isolates the high-side circuit region from the substrate potential to have a high breakdown voltage. The high-voltage N-ch MOS and high-voltage P-ch MOS have the same level of breakdown voltage as that of the high-voltage isolation region. A spiral polysilicon portion 9 surrounds the outer periphery of the high-side circuit region in the RESURF structure.

Figure 5:
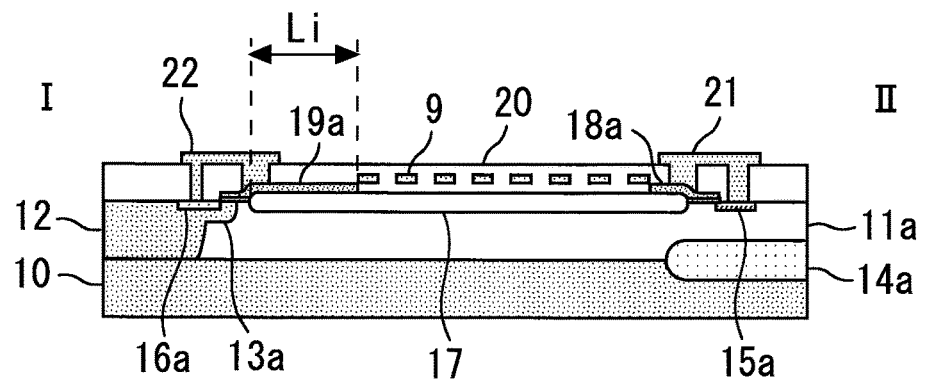
FIG. 5 is a cross-sectional view of the high-voltage isolation region along I-II of FIG. 4.

FIG. 5 is a cross-sectional view of the high-voltage isolation region along I-II of FIG. 4. A P-type epitaxial layer (not shown) is formed on a P-type substrate 10, and an N-type diffusion layer 11a that is the RESURF region is formed thereon. A P-type diffusion layer 12 that reaches the P-type substrate 10 surrounds the high-side circuit region and the N-type diffusion layer 11a. A P-type diffusion layer 13a is formed on the inner side of one end of the P-type diffusion layer 12 such as to partly overlap the P-type diffusion layer 12. An N$^+$-type buried diffusion layer 14a is formed on the inner side of one end of the P-type diffusion layer 13a such as to be in contact with the lower face of the P-type epitaxial layer. An N$^+$-type diffusion layer 15a is formed on the surface of the N-type diffusion layer 11a at a certain distance from the P-type diffusion layer 12. A P$^+$-type diffusion layer 16a is formed on a surface portion of the P-type diffusion layer 13a. A thermal oxide film 17 is formed on the upper face of the N-type diffusion layer 11a between the P-type diffusion layer 12 and the N+-type diffusion layer 15a. Polysilicon portions 18a and 19a are formed at a certain distance from each other such as to cover an inner end portion and an outer end portion of the thermal oxide film 17, respectively. An insulating film 20 is formed such as to cover the surfaces of these components.

Metal wiring layers 21 and 22 are formed on the insulating film 20. The metal wiring layer 21 is electrically connected to the N+-type diffusion layer 15a and the polysilicon portion 18a through a contact hole. The metal wiring layer 22 is electrically connected to the P+-type diffusion layer 16a and the polysilicon portion 19a via a contact hole that extends through the insulating film 20.

The polysilicon portion 9 is formed inside the insulating film 20. One end of the polysilicon portion 9 is electrically connected to the metal wiring layer 22 while the other end is electrically connected to the metal wiring layer 21. The impurity concentration is higher in the order of the N+-type buried diffusion layer 14a, the P-type diffusion layer 12, the N-type diffusion layer 11a, and the P-type substrate 10. The N-type diffusion layer 11a satisfies the RESURF conditions.

Figure 6:
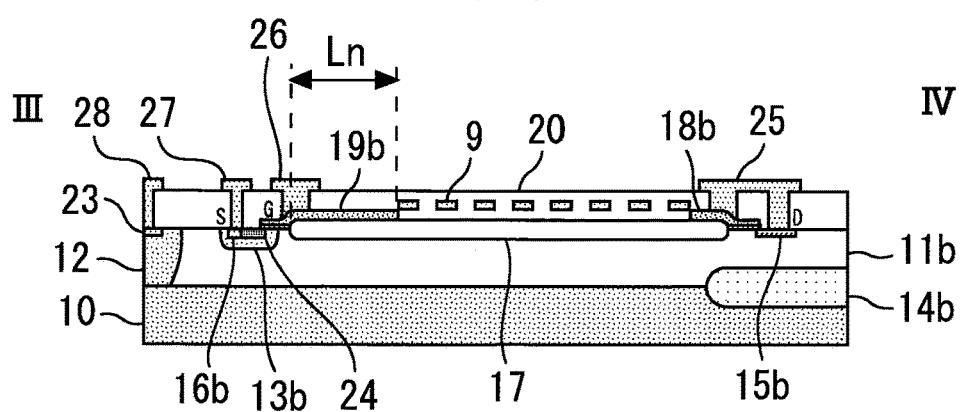
FIG. 6 is a cross-sectional view of the high-voltage N-ch MOS along III-IV of FIG. 4.

FIG. 6 is a cross-sectional view of the high-voltage N-ch MOS along III-IV of FIG. 4. An N-type diffusion layer 11b of the high-voltage N-ch MOS is electrically isolated from the N-type diffusion layer 11a of the high-voltage isolation region (the isolation structure is not shown; see, for example, PTL 2 and NPL 2). An N+-type buried diffusion layer 14b is also electrically isolated from the N+-type buried diffusion layer 14a. A P+-type diffusion layer 23 is formed on a surface portion of the P-type diffusion layer 12. A P-type diffusion layer 13b is formed on the surface of the N-type diffusion layer 11b between the P-type diffusion layer 12 and the thermal oxide film 17. An N+-type diffusion layer 15b is formed on the surface of the N-type diffusion layer 11b at a certain distance from the P-type diffusion layer 12. A P+-type diffusion layer 16b and an N+-type diffusion layer 24 are formed on surface portions of the P-type diffusion layer 13b.

Polysilicon portions 18b and 19b are formed on the thermal oxide film 17 at a certain distance from each other such as to cover an inner end portion and an outer end portion of the thermal oxide film 17, respectively. The polysilicon portion 19b extends also over the P-type diffusion layer 13b via a gate oxide film. The polysilicon portion 9 is formed on the thermal oxide film 17 between the polysilicon portions 18b and 19b.

Metal wiring layers 25, 26, 27, and 28 are formed on the insulating film 20. The metal wiring layer 25 is electrically connected to the N+-type diffusion layer 15b and the polysilicon portion 18b through a contact hole. The metal wiring layer 26 is electrically connected to the polysilicon portion 19b through a contact hole. The metal wiring layer 27 is electrically connected to the P+-type diffusion layer 16b and N+-type diffusion layer 24 through a contact hole. The metal wiring layer 28 is electrically connected to the P+-type diffusion layer 23 via a contact hole that extends through the insulating film 20. The metal wiring layer 28 is also electrically connected to the metal wiring layer 22.

Figure 7:
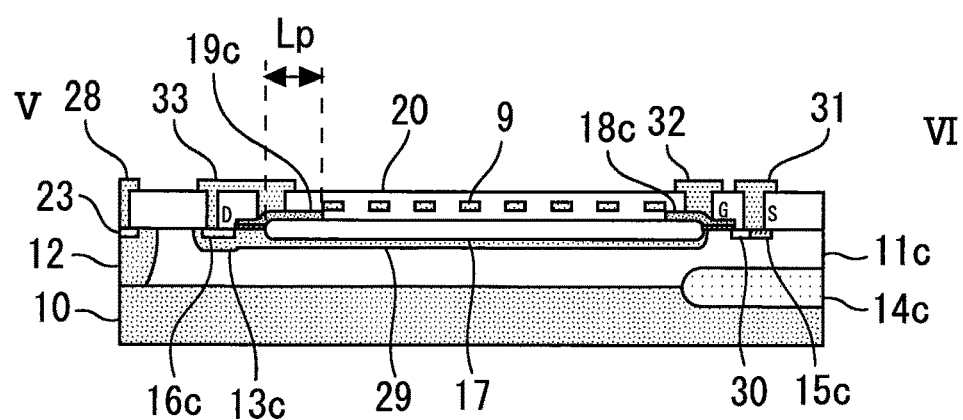
FIG. 7 is a cross-sectional view of the high-voltage P-ch MOS along V-VI of FIG. 4.

FIG. 7 is a cross-sectional view of the high-voltage P-ch MOS along V-VI of FIG. 4. An N-type diffusion layer 11c of the high-voltage P-ch MOS is electrically isolated from the N-type diffusion layer 11a of the high-voltage isolation region. An N+-type buried diffusion layer 14c is also electrically isolated from the N+-type buried diffusion layer 14a. A P-type diffusion layer 13c is formed on the surface of the N-type diffusion layer 11c between the P-type diffusion layer 12 and the thermal oxide film 17. A P+-type diffusion layer 16c is formed on a surface portion of the P-type diffusion layer 13c. A P-type diffusion layer 29 is formed on the surface of the N-type diffusion layer 11c such as to be in contact with the lower face of the thermal oxide film 17. A P+-type diffusion layer 30 is formed on the surface of the N-type diffusion layer 11c at a certain distance from the P-type diffusion layer 29. An N+-type diffusion layer 15c is formed on one side of the P-type diffusion layer 30 opposite from the P-type diffusion layer 29.

Polysilicon portions 18c and 19c are formed at a certain distance from each other such as to cover an inner end portion and an outer end portion of the thermal oxide film 17, respectively. The polysilicon portion 18c is formed on the N-type diffusion layer 11c between the P-type diffusion layer 29 and the P-type diffusion layer 30 via a gate oxide film. Metal wiring layers 31, 32, and 33 are formed on the insulating film 20. The metal wiring layer 31 is electrically connected to the P+-type diffusion layer 30 and N+-type diffusion layer 15c through a contact hole. The metal wiring layer 32 is electrically connected to the polysilicon portion 18c through a contact hole. The metal wiring layer 33 is electrically connected to the P+-type diffusion layer 16c and the polysilicon portion 19c via a contact hole that extends through the insulating film 20.

Here, the polysilicon portions 9, 18a, and 19a of the high-voltage isolation region, the polysilicon portions 9, 18b, and 19b of the high-voltage N-ch MOS, and the polysilicon portions 9, 18c, and 19c of the high-voltage P-ch MOS are the field plates.

The length Ln of the polysilicon portion 19b on the thermal oxide film 17 of the high-voltage N-ch MOS that is the field plate located closest to the low-side circuit region, the length Li of the polysilicon portion 19a on the thermal oxide film 17 of the high-voltage isolation region, and the length Lp of the polysilicon portion 19c on the thermal oxide film 17 of the high-voltage P-ch MOS, satisfy the relationship expressed by Formula 1 below.

$$Ln=Li>Lp \qquad (1)$$

Thus, the inner end of the polysilicon portion 19c that is the field plate of the high-voltage P-ch MOS located closest to the low-side circuit region is positioned closer to the low-side circuit region than the inner end of the polysilicon portion 19b that is the field plate of the high-voltage N-ch MOS located closest to the low-side circuit region.

The plurality of polysilicon portions 9 in the high-voltage P-ch MOS are spaced apart at larger intervals than those of the plurality of polysilicon portions 9 in the high-voltage N-ch MOS and in the high-voltage isolation region. The intervals of the plurality of polysilicon portions 9 in the high-voltage P-ch MOS need not be constant.

Figure 8:
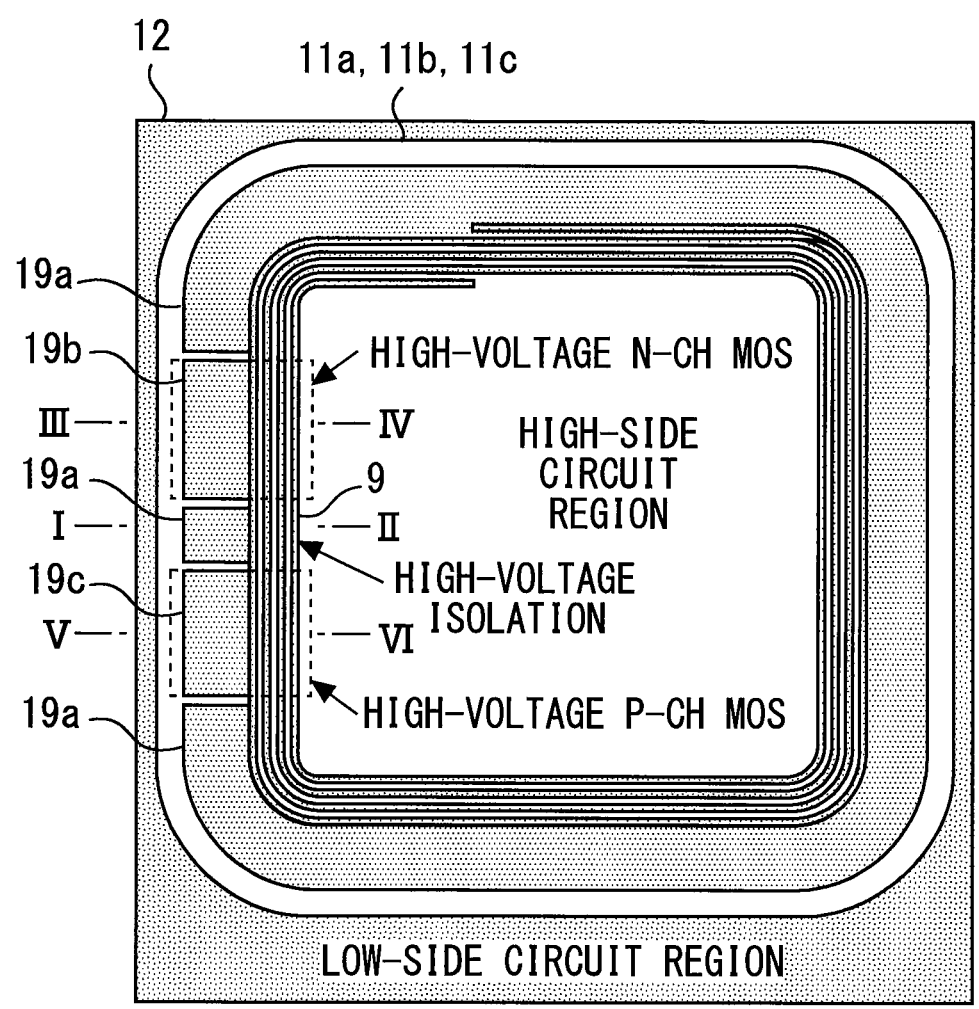
FIG. 8 is a plan view illustrating a high-side circuit region of a semiconductor device according to the comparative example.
Figure 9:
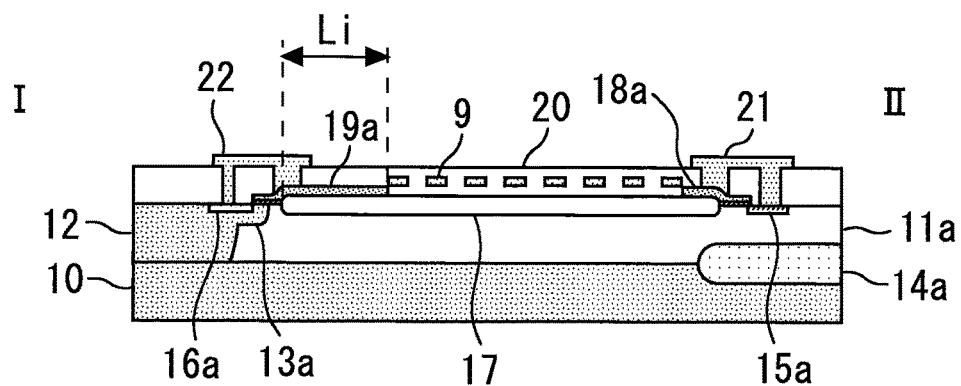
FIG. 9 is a cross-sectional view of a high-voltage isolation region along I-II of FIG. 8.
Figure 10:
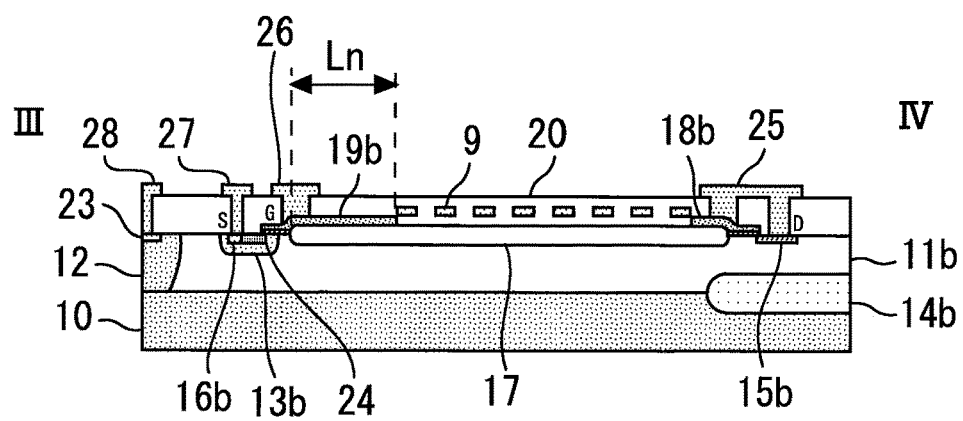
FIG. 10 is a cross-sectional view of a high-voltage N-ch MOS along III-IV of FIG. 8.
Figure 11:
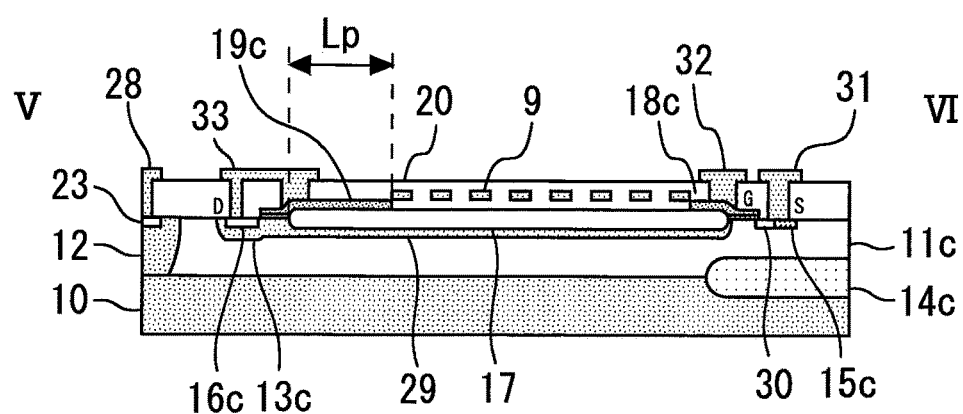
FIG. 11 is a cross-sectional view of a high-voltage P-ch MOS along V-VI of FIG. 8.

Next, the advantageous effects of this embodiment will be explained in comparison to a comparative example. FIG. 8 is a plan view illustrating a high-side circuit region of a semiconductor device according to the comparative example. FIG. 9 is a cross-sectional view of a high-voltage isolation region along I-II of FIG. 8. FIG. 10 is a cross-sectional view of a high-voltage N-ch MOS along III-IV of FIG. 8. FIG. 11 is a cross-sectional view of a high-voltage P-ch MOS along V-VI of FIG. 8. In the comparative example, the high-voltage isolation region, the high-voltage N-ch MOS, and the high-voltage P-ch MOS all have the same field plate structure (Ln=Li=Lp).

The high-voltage N-ch MOS maintains the high breakdown voltage by full depletion of the N-type diffusion layer 11b. The high-voltage P-ch MOS maintains the high breakdown voltage by full depletion of the P-type diffusion layer 29 on the surface in addition to the N-type diffusion layer 11c. Therefore, in both of the high-voltage N-ch MOS and high-voltage P-ch MOS, a transient leakage current flows during a period in which the depletion layer spreads within the high-voltage isolation region, from a time point when a high voltage is applied, until full depletion is achieved. A prolonged period of this transient leakage current flow could induce a malfunction of the level shift circuit 6.

Figure 12:
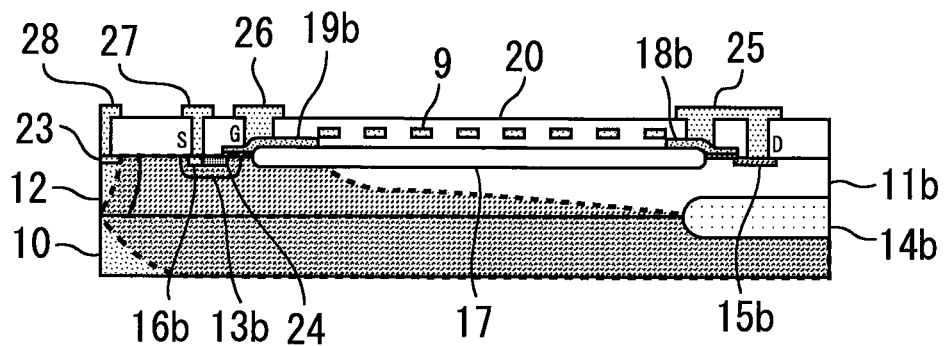
FIG. 12 is a cross-sectional view for explaining a depletion process of the high-voltage N-ch MOS according to the comparative example.
Figure 13:
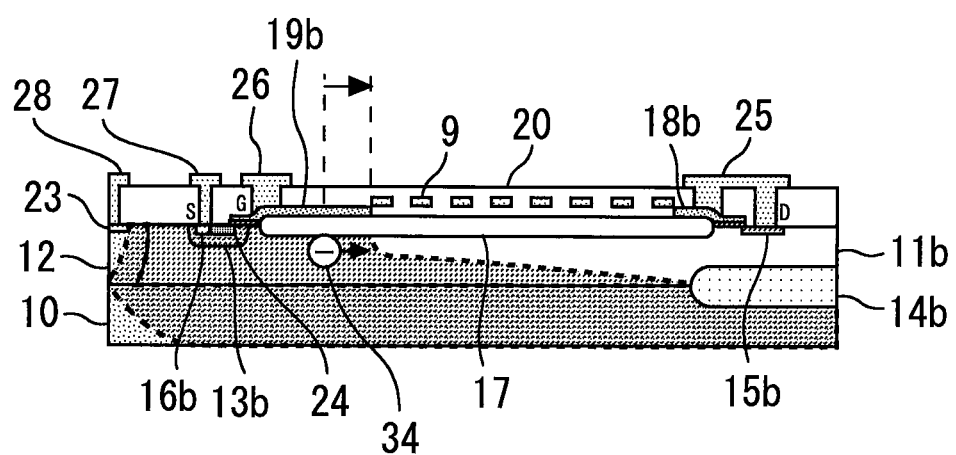
FIG. 13 is a cross-sectional view for explaining a depletion process of the high-voltage N-ch MOS according to the comparative example.

FIG. 12 and FIG. 13 are cross-sectional views for explaining a depletion process of the high-voltage N-ch MOS according to the comparative example. Referring to FIG. 13, the polysilicon portion 19b that is the field plate located closest to the low-side circuit region is longer than that of FIG. 12, this low-voltage polysilicon portion 19b extending out more toward the high-side circuit region. Therefore, when a high voltage and a low voltage are applied to the metal wiring layer 25, and the metal wiring layers 26, 27 and 28, respectively, the mobility of electrons 34 in the N-type diffusion layer 11b toward the high side is increased. Depletion is thus accelerated, which shortens the period of transient leakage current flow.

Figure 14:
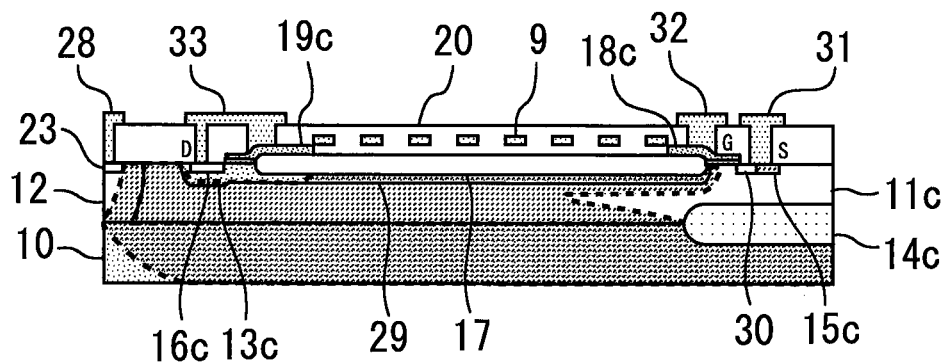
FIG. 14 is a cross-sectional view for explaining a depletion process of the high-voltage P-ch MOS according to the comparative example.
Figure 15:
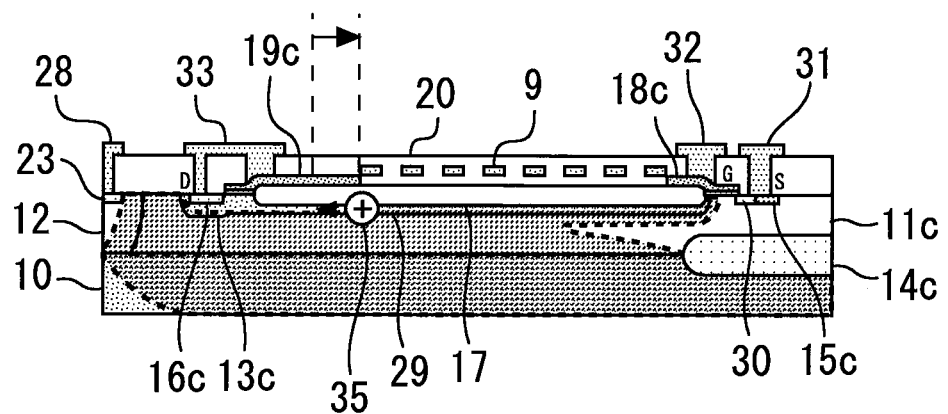
FIG. 15 is a cross-sectional view for explaining a depletion process of the high-voltage P-ch MOS according to the comparative example.

FIG. 14 and FIG. 15 are cross-sectional views for explaining a depletion process of the high-voltage P-ch MOS according to the comparative example. Referring to FIG. 15, the polysilicon portion 19c that is the field plate located closest to the low-side circuit region is longer than that of FIG. 14, this low-voltage polysilicon portion 19c extending out more toward the high-side circuit region. Therefore, when a high voltage and a low voltage are applied to the metal wiring layers 31 and 32, and the metal wiring layers 28 and 33, respectively, the holes 35 in the P-type diffusion layer 29 are attracted below the polysilicon portion 19c. Depletion of the P-type diffusion layer 29 is thus inhibited, which prolongs the period of transient leakage current flow.

In contrast, according to this embodiment, the polysilicon portion 19b that is the field plate located closest to the low-side circuit region in the high-voltage N-ch MOS is long and extends out toward the high-side circuit region, so that depletion of the N-type diffusion layer 11b is accelerated. On the other hand, the polysilicon portion 19c that is the field plate located closest to the low-side circuit region in the high-voltage P-ch MOS is short and its inner end portion is located closer to the low-side circuit region than that of the high-voltage N-ch MOS, so that depletion of the P-type diffusion layer 29 is accelerated. Thus, the period in which a transient leakage current flows when a high voltage is applied is shortened in both of the high-voltage N-ch MOS and high-voltage P-ch MOS, whereby the malfunction tolerance of the level shift circuit 6 can be improved.

Embodiment 2

Figure 16:
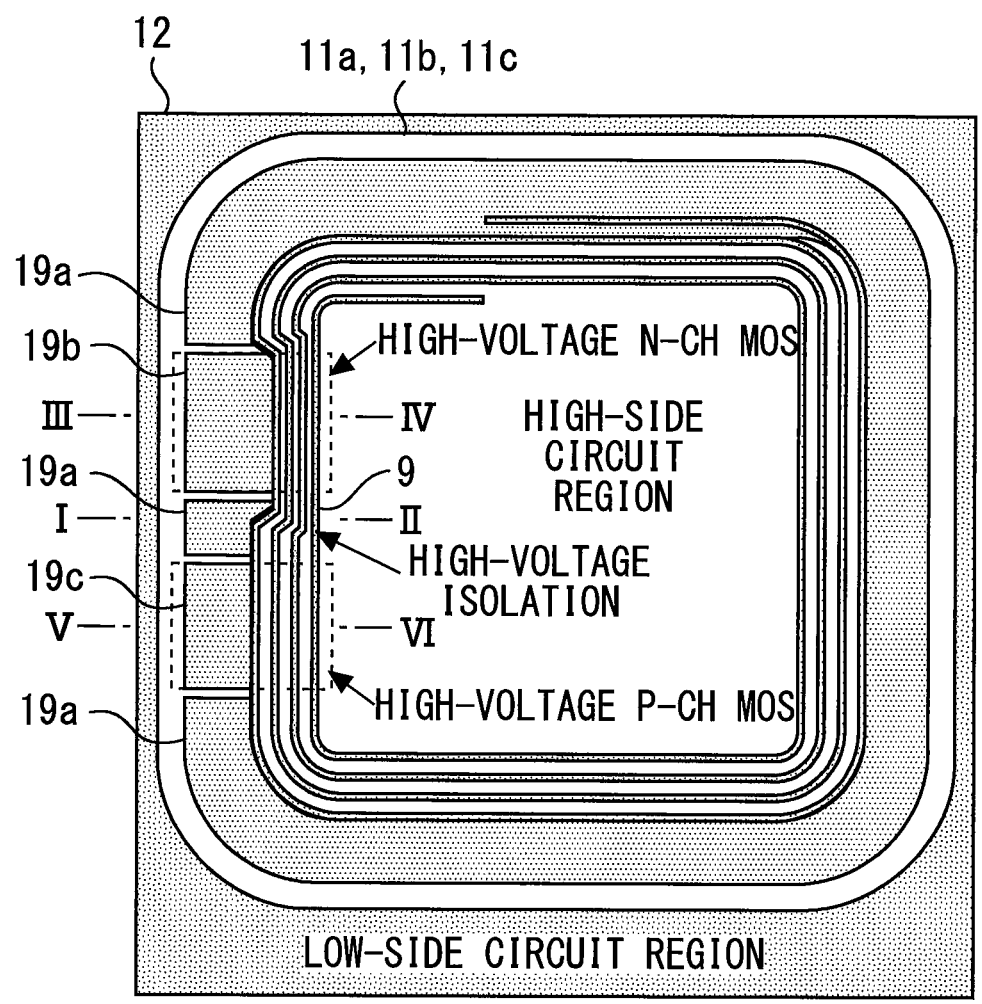
FIG. 16 is a plan view illustrating a high-side circuit region of a semiconductor device according to Embodiment 2 of the present invention.
Figure 17:
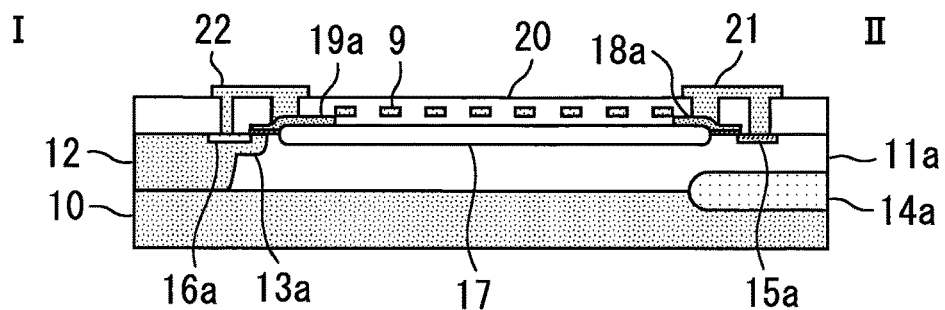
FIG. 17 is a cross-sectional view of a high-voltage isolation region along I-II of FIG. 16.
Figure 18:
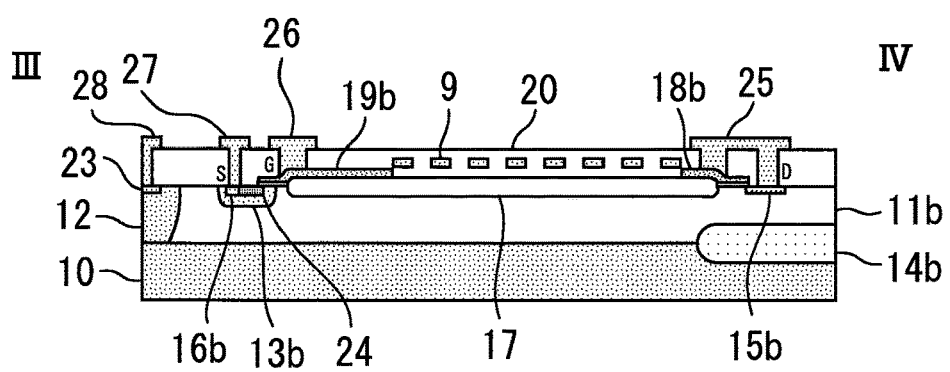
FIG. 18 is a cross-sectional view of a high-voltage N-ch MOS along III-IV of FIG. 16.
Figure 19:
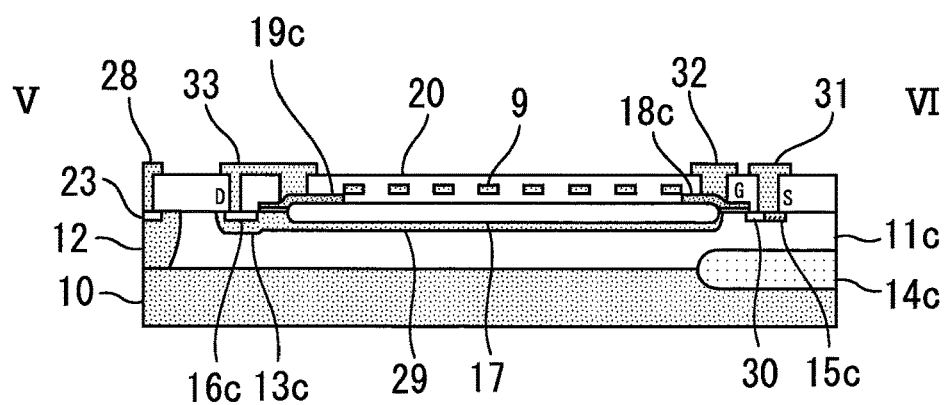
FIG. 19 is a cross-sectional view of a high-voltage P-ch MOS along V-VI of FIG. 16.

FIG. 16 is a plan view illustrating a high-side circuit region of a semiconductor device according to Embodiment 2 of the present invention. FIG. 17 is a cross-sectional view of a high-voltage isolation region along I-II of FIG. 16. FIG. 18 is a cross-sectional view of a high-voltage N-ch MOS along III-IV of FIG. 16. FIG. 19 is a cross-sectional view of a high-voltage P-ch MOS along V-VI of FIG. 16.

In this embodiment, the plurality of polysilicon portions 9 in the high-voltage P-ch MOS and in the high-voltage isolation region are spaced apart at larger intervals than those of the plurality of polysilicon portions 9 in the high-voltage N-ch MOS. The length Ln of the polysilicon portion 19b on the thermal oxide film 17 of the high-voltage N-ch MOS, the length Li of the polysilicon portion 19a on the thermal oxide film 17 of the high-voltage isolation region, and the length Lp of the polysilicon portion 19c on the thermal oxide film 17 of the high-voltage P-ch MOS, satisfy the relationship expressed by Formula 2 below.

$$Ln > Li = Lp \qquad (2)$$

In the configuration of this embodiment, too, the inner end of the polysilicon portion 19c that is the field plate of the high-voltage P-ch MOS located closest to the low-side circuit region is positioned closer to the low-side circuit region than the inner end of the polysilicon portion 19b that is the field plate of the high-voltage N-ch MOS located closest to the low-side circuit region. Thus, the same effects as those of Embodiment 1 can be achieved.

Embodiment 3

Figure 20:
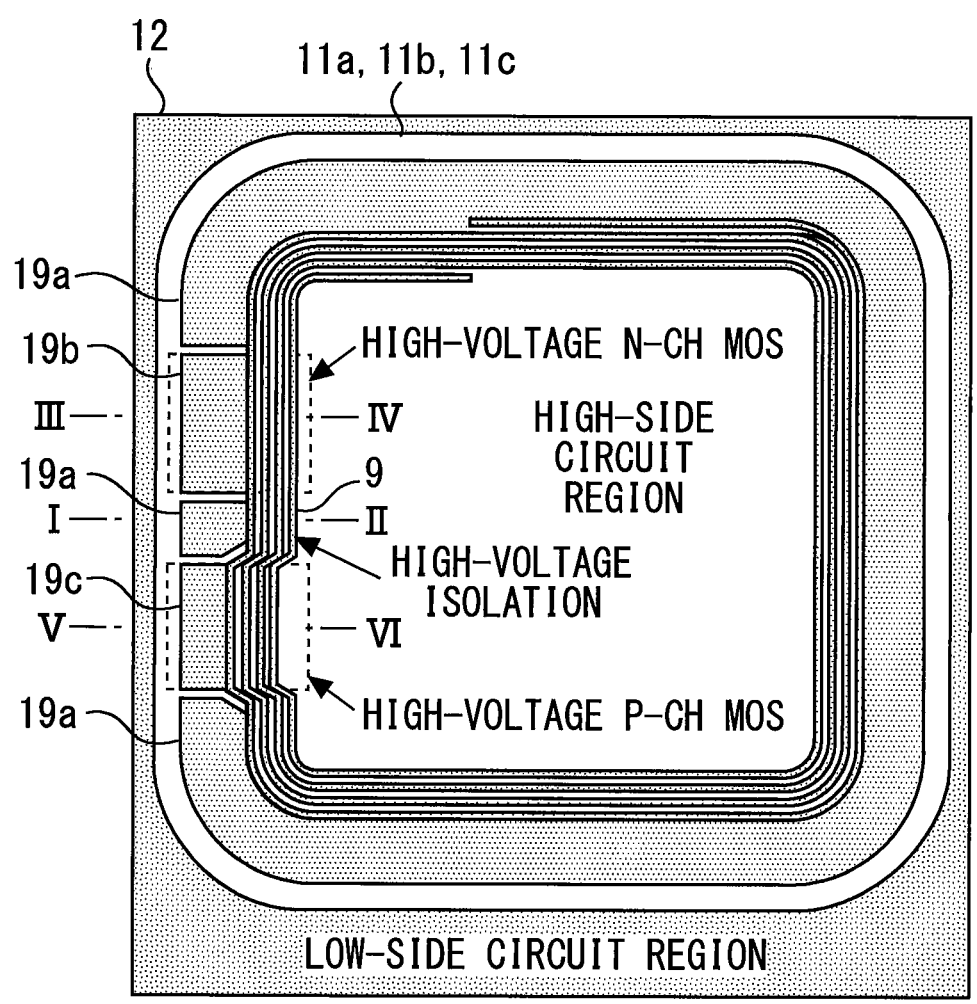
FIG. 20 is a plan view illustrating a high-side circuit region of a semiconductor device according to Embodiment 3 of the present invention.
Figure 21:
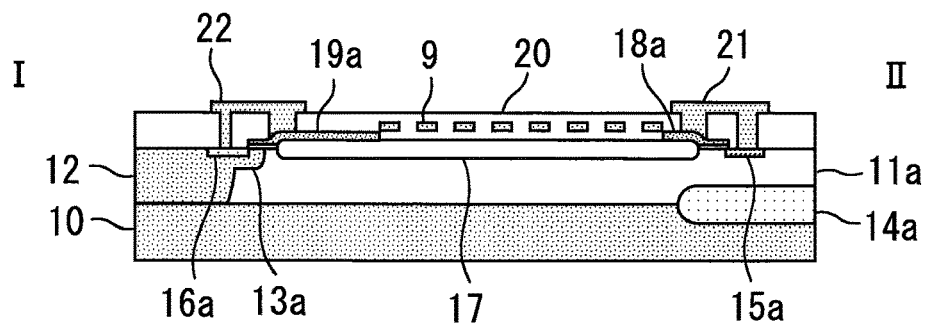
FIG. 21 is a cross-sectional view of a high-voltage isolation region along I-II of FIG. 20.
Figure 22:
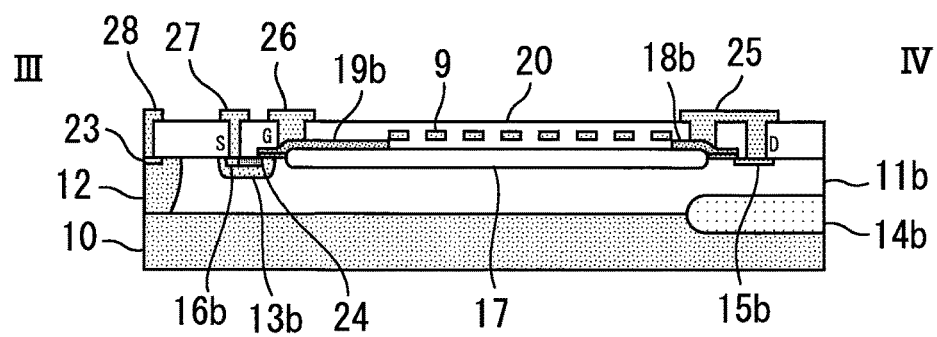
FIG. 22 is a cross-sectional view of a high-voltage N-ch MOS along III-IV of FIG. 20.
Figure 23:
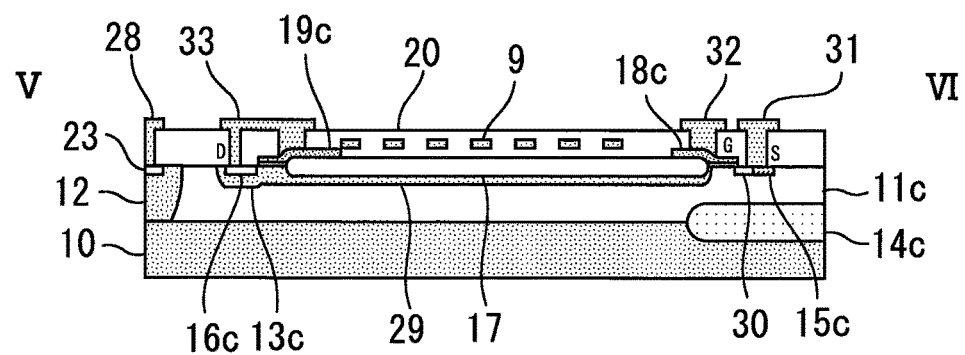
FIG. 23 is a cross-sectional view of a high-voltage P-ch MOS along V-VI of FIG. 20.

FIG. 20 is a plan view illustrating a high-side circuit region of a semiconductor device according to Embodiment 3 of the present invention. FIG. 21 is a cross-sectional view of a high-voltage isolation region along I-II of FIG. 20. FIG. 22 is a cross-sectional view of a high-voltage N-ch MOS along III-IV of FIG. 20. FIG. 23 is a cross-sectional view of a high-voltage P-ch MOS along V-VI of FIG. 20.

In this embodiment, intervals of parts of the spiral polysilicon portion 9 are same in the high-voltage isolation region, the high-voltage N-ch MOS, and the high-voltage P-ch MOS. The plurality of polysilicon portions 9 in the high-voltage P-ch MOS are positioned closer to the low-side circuit region than the plurality of polysilicon portions 9 in the high-voltage N-ch MOS.

In the configuration of this embodiment, too, the inner end of the polysilicon portion 19c that is the field plate of the high-voltage P-ch MOS located closest to the low-side circuit region is positioned closer to the low-side circuit region than the inner end of the polysilicon portion 19b that is the field plate of the high-voltage N-ch MOS located closest to the low-side circuit region. Thus, the same effects as those of Embodiment 1 can be achieved. Moreover, since there is no need to increase the intervals between the plurality of polysilicon portions 9 of the high-voltage P-ch MOS, deterioration of the stability of breakdown voltage can be minimized.

Embodiment 4

Figure 24:
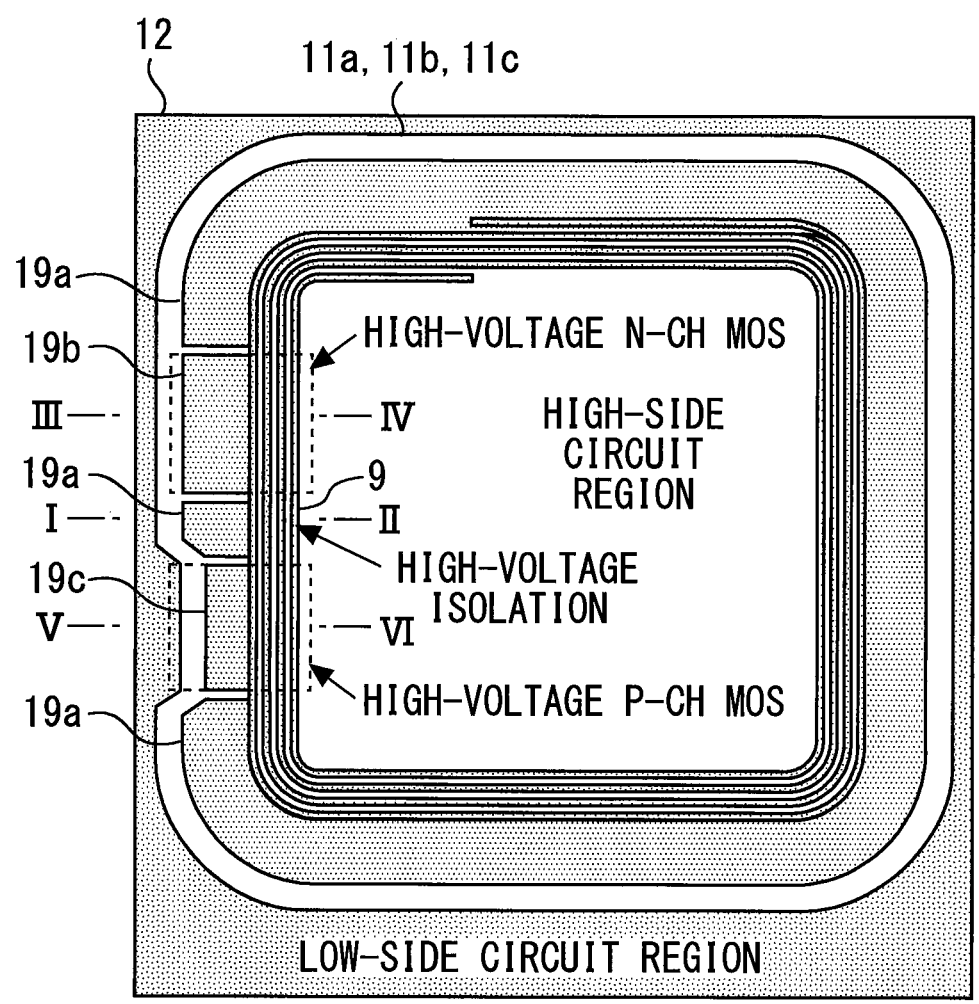
FIG. 24 is a plan view illustrating a high-side circuit region of a semiconductor device according to Embodiment 4 of the present invention.
Figure 25:
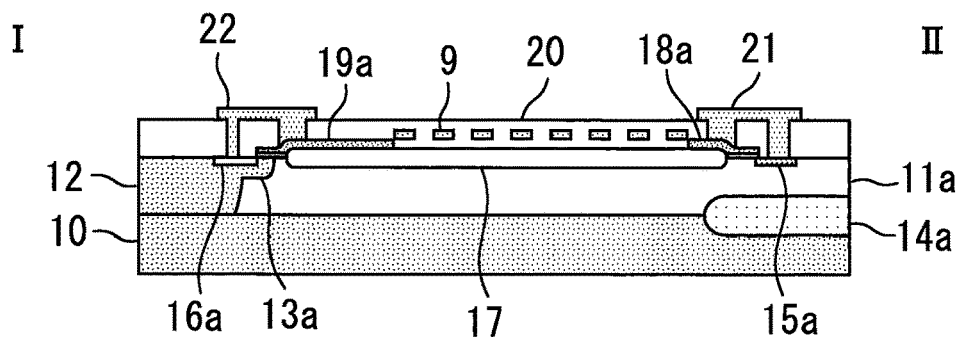
FIG. 25 is a cross-sectional view of a high-voltage isolation region along I-II of FIG. 24.
Figure 26:
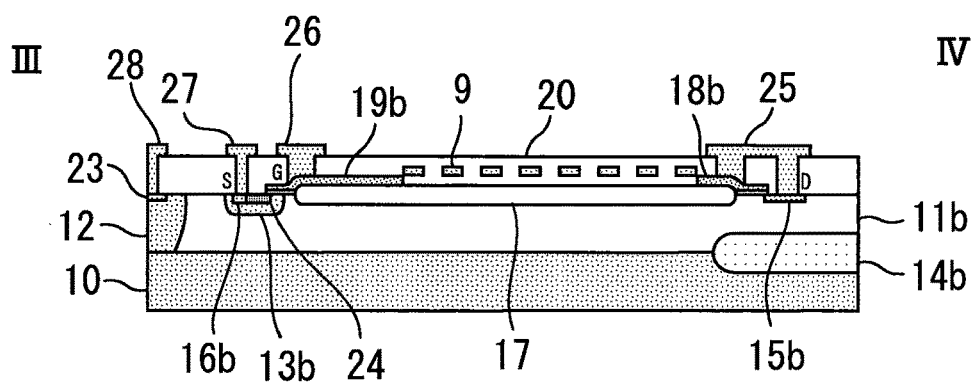
FIG. 26 is a cross-sectional view of a high-voltage N-ch MOS along III-IV of FIG. 24.
Figure 27:
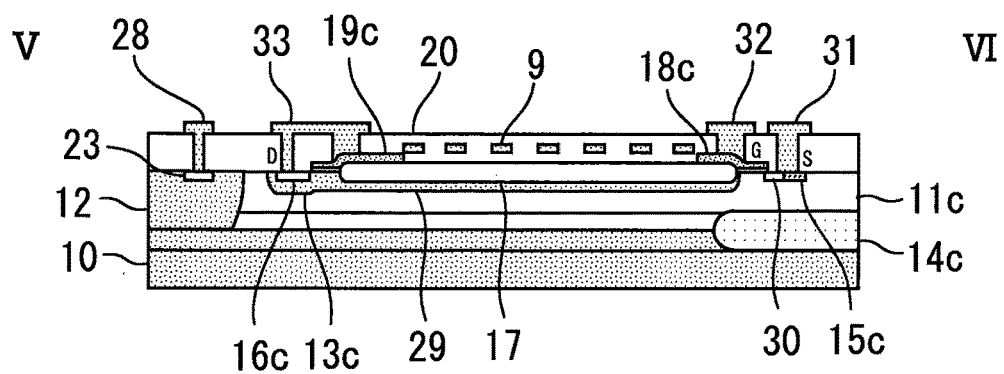
FIG. 27 is a cross-sectional view of a high-voltage P-ch MOS along V-VI of FIG. 24.

FIG. 24 is a plan view illustrating a high-side circuit region of a semiconductor device according to Embodiment 4 of the present invention. FIG. 25 is a cross-sectional view of a high-voltage isolation region along I-II of FIG. 24. FIG. 26 is a cross-sectional view of a high-voltage N-ch MOS along III-IV of FIG. 24. FIG. 27 is a cross-sectional view of a high-voltage P-ch MOS along V-VI of FIG. 24.

In this embodiment, similarly to Embodiment 1, the polysilicon portion 19c that is the field plate located closest to the low-side circuit region in the high-voltage P-ch MOS is shorter than the polysilicon portion 19b that is the field plate located closest to the low-side circuit region in the high-voltage N-ch MOS. The polysilicon portion 19c on the thermal oxide film 17 of the high-voltage P-ch MOS is shifted parallelly toward the polysilicon portion 18c so that the distance between them equals to the distance between the polysilicon portions 18a and 19a, and the distance between the polysilicon portions 18b and 19b. Namely, the distance between the field plate closest to the low-side circuit region and the field plate closest to the high-side circuit region is the same in all of the high-voltage isolation region, the high-voltage N-ch MOS, and the high-voltage P-ch MOS. The P-type diffusion layer 12, the P+-type diffusion layer 23, the P+-type diffusion layer 16c, the P-type diffusion layer 13c, and the metal wiring layer 33 are also shifted parallelly toward the polysilicon portion 18c by the same length as the polysilicon portion 19c. The length of the P-type diffusion layer 29 and the thermal oxide film 17 is reduced by the length of movement of the polysilicon portion 19c.

Thus, the period in which a transient leakage current flows when a high voltage is applied is shortened in both of the high-voltage N-ch MOS and high-voltage P-ch MOS, whereby the malfunction tolerance of the level shift circuit 6 can be improved.

Moreover, since the distance between the field plate closest to the low-side circuit region and the field plate closest to the high-side circuit region is the same in all of the high-voltage isolation region, the high-voltage N-ch MOS, and the high-voltage P-ch MOS, the spiral polysilicon portion 9 can be placed as it is at the same position. Thus the spiral polysilicon portion 9 can be formed by only straight lines and circular arc patterns so that the layout design is made easy. Also, the space for the low-side region of the high-voltage P-ch MOS can be saved.

Embodiment 5

Figure 28:
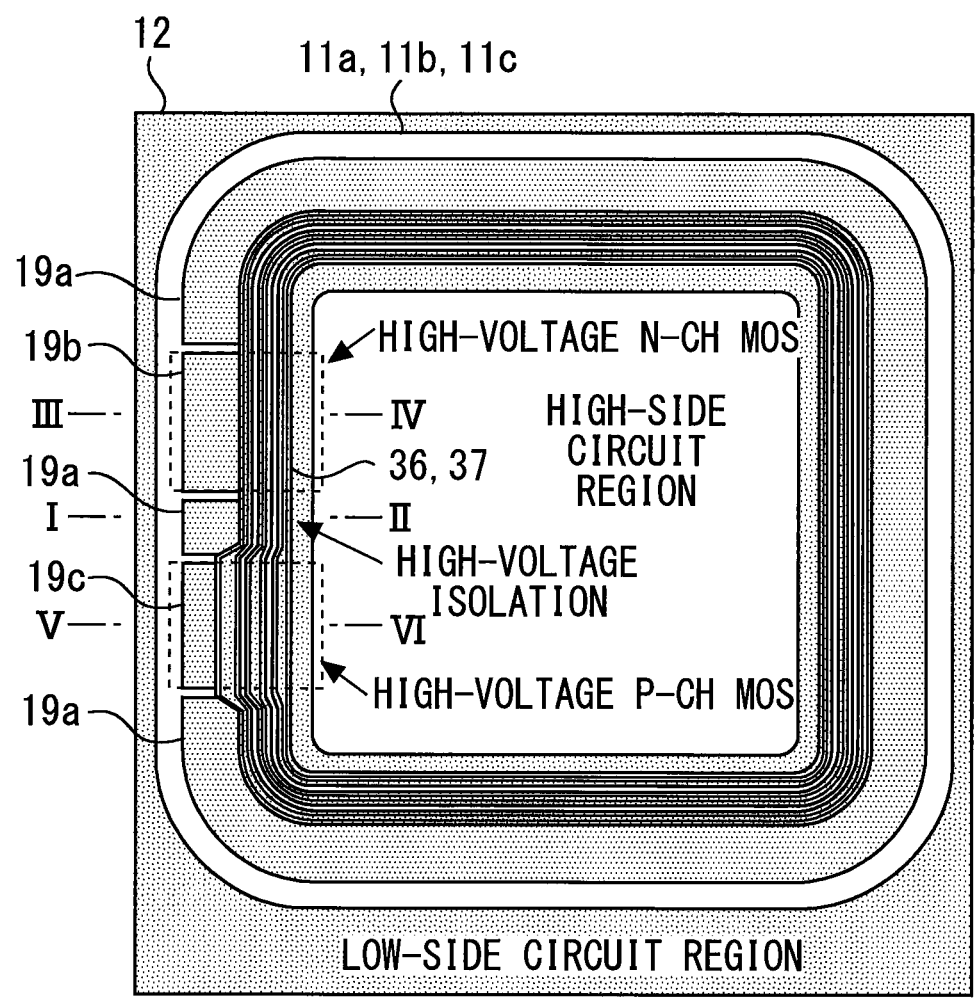
FIG. 28 is a plan view illustrating a high-side circuit region of a semiconductor device according to Embodiment 5 of the present invention.
Figure 29:
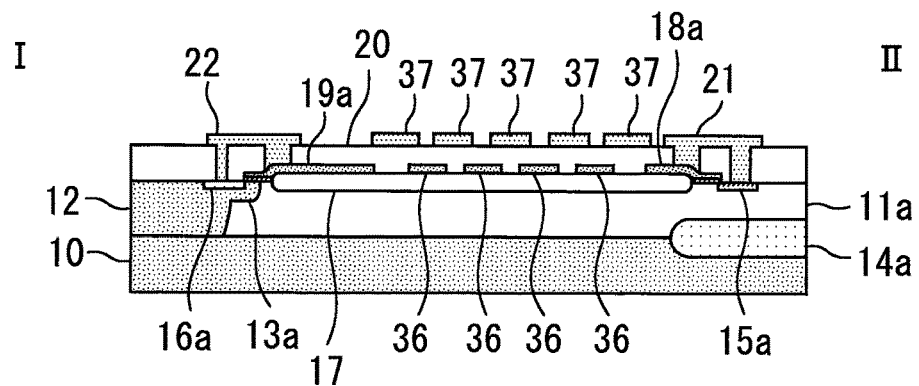
FIG. 29 is a cross-sectional view of a high-voltage isolation region along I-II of FIG. 28.
Figure 30:
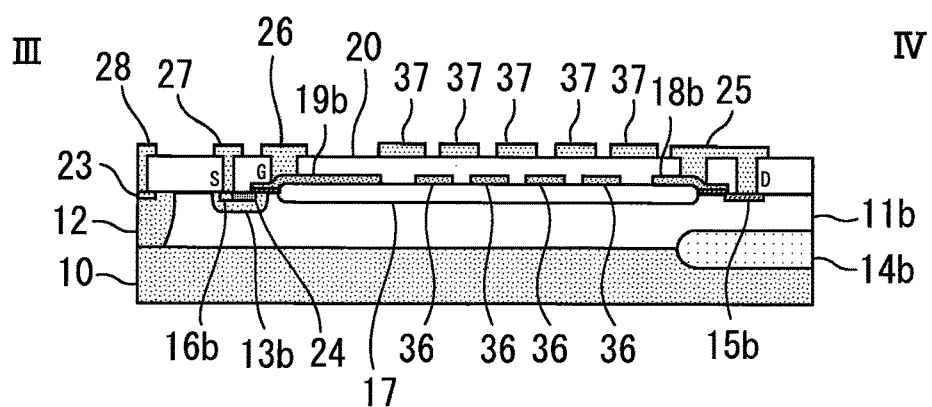
FIG. 30 is a cross-sectional view of a high-voltage N-ch MOS along III-IV of FIG. 28.
Figure 31:
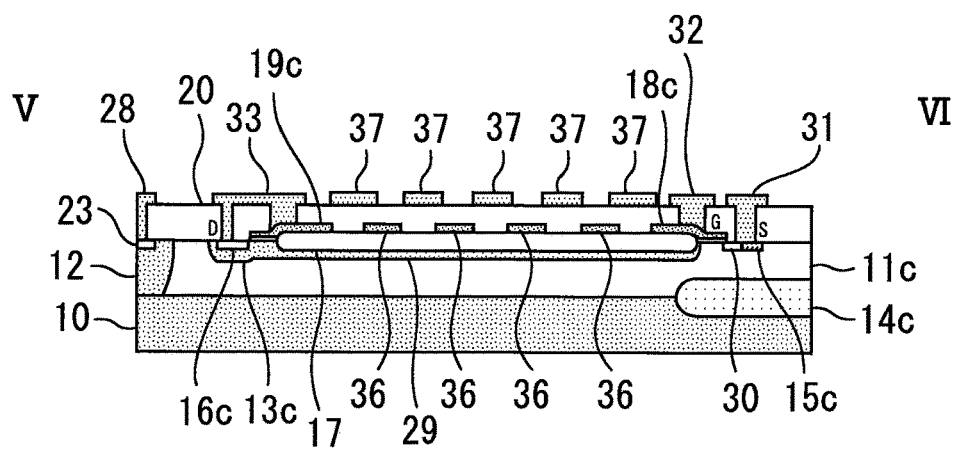
FIG. 31 is a cross-sectional view of a high-voltage P-ch MOS along V-VI of FIG. 28.

FIG. 28 is a plan view illustrating a high-side circuit region of a semiconductor device according to Embodiment 5 of the present invention. FIG. 29 is a cross-sectional view of a high-voltage isolation region along I-II of FIG. 28. FIG. 30 is a cross-sectional view of a high-voltage N-ch MOS along III-IV of FIG. 28. FIG. 31 is a cross-sectional view of a high-voltage P-ch MOS along V-VI of FIG. 28.

In this embodiment, a polysilicon portion 36 and a metal wiring layer 37 that are capacitively-coupled to each other are formed on a thermal oxide film 17 instead of the spiral polysilicon portion 9 of Embodiment 1. In this case, too, the same effects as those of Embodiment 1 can be achieved.

The polysilicon portion 36 is made of the same layer as the polysilicon portions 18a, 18b, 18c, 19a, 19b, and 19c, while the metal wiring layer 37 is made of the same layer as the metal wiring layers 21, 22, 25, 26, 27, 28, 31, 32, and 33, so that they can be respectively formed simultaneously. Therefore, as compared to Embodiment 1, the step of forming the polysilicon portion 9 can be omitted.

The P-type substrate 10 and the semiconductor layer thereon are not limited to ones formed of silicon, but instead may be formed of a wide-bandgap semiconductor having a bandgap wider than that of silicon. The wide-bandgap semiconductor is, for example, a silicon carbide, a gallium-nitride-based material, or diamond. A power semiconductor device formed of such a wide-bandgap semiconductor has a high voltage resistance and a high allowable current density, and thus can be miniaturized. The use of such a miniaturized semiconductor device enables the miniaturization and high integration of the semiconductor module in which the semiconductor device is incorporated. Further, since the semiconductor device has a high heat resistance, a radiation fin of a heatsink can be miniaturized and a water-cooled part can be air-cooled, which leads to further miniaturization of the semiconductor module. Further, since the semiconductor device has a low power loss and a high efficiency, a highly efficient semiconductor module can be achieved.

REFERENCE SIGNS LIST 4 high-side circuit region; 5 low-side circuit region; 7 high-voltage N-ch MOS; 8 high-voltage P-ch MOS; 9,18a, 18b,18c,19a,19b,19c,36 polysilicon portion; 17 thermal oxide film; 37 metal wiring layer

The invention claimed is:

1. A semiconductor device comprising:
   a high-side circuit region;
   a low-side circuit region; and
   a reduced surface field (RESURF) isolation structure surrounding an outer periphery of the high-side circuit region to isolate the high-side circuit region and the low-side circuit region from each other, wherein
   the RESURF isolation structure includes a high-voltage isolation region, a high-voltage n-channel metal-oxide semiconductor (N-ch MOS), and a high-voltage p-channel metal-oxide semiconductor (P-ch MOS),
   the high-voltage isolation region, the high-voltage N-ch MOS, and the high-voltage P-ch MOS include a thermal oxide film, and a plurality of field plates provided on the thermal oxide film,
   the plurality of field plates includes at least a first field plate directly covering an inner end portion of the thermal oxide film in each of the high-voltage isolation region, the high-voltage N-ch MOS, and the high-voltage P-ch MOS; and a second field plate directly covering an outer end portion of the thermal oxide film in each of the high-voltage isolation region, the high-voltage N-ch MOS, and the high-voltage P-ch MOS, and
   an inner end of the second field plate of the high-voltage P-ch MOS located closest to the low-side circuit region is positioned closer to the low-side circuit region than an inner end of the second field plate of the high-voltage N-ch MOS located closest to the low-side circuit region.

2. The semiconductor device according to claim 1, wherein
   the plurality of field plates contain a spiral poly silicon portion provided on the thermal oxide film, and
   parts of the spiral polysilicon portion in the high-voltage P-ch MOS are spaced apart at larger intervals than those of parts of the spiral polysilicon portion in the high-voltage N-ch MOS.

3. The semiconductor device according to claim 1, wherein
   the plurality of field plates contain a spiral polysilicon portion provided on the thermal oxide film,
   intervals of parts of the spiral polysilicon portion are same in the high-voltage N-ch MOS and the high-voltage P-ch MOS, and
   the spiral polysilicon portion in the high-voltage P-ch MOS is positioned closer to the low-side circuit region than the spiral polysilicon portion in the high-voltage N-ch MOS.

4. The semiconductor device according to claim 1, wherein
   the plurality of field plates contain a polysilicon portion and a metal wiring layer provided on the thermal oxide film and capacitively-coupled to each other.

5. A semiconductor device comprising:
   a high-side circuit region;
   a low-side circuit region; and
   a reduced surface field (RESURF) isolation structure surrounding an outer periphery of the high-side circuit region to isolate the high-side circuit region and the low-side circuit region from each other, wherein
   the RESURF isolation structure includes a high-voltage isolation region, a high-voltage n-channel metal-oxide semiconductor (N-ch MOS), and a high-voltage p-channel metal-oxide semiconductor (P-ch MOS), the high-voltage isolation region, the high-voltage N-ch MOS, and the high-voltage P-ch MOS include a thermal oxide film, and a plurality of field plates containing a spiral polysilicon portion provided on the thermal oxide film, a field plate located closest to the low-side circuit region in the high-voltage P-ch MOS is shorter than a field plate located closest to the low-side circuit region in the high-voltage N-ch MOS, and a distance between the field plate closest to the low-side circuit region and the field plate closest to the high-side circuit region is same in all of the high-voltage isolation region, the high-voltage N-ch MOS, and the high-voltage P-ch MOS.

6. A semiconductor device comprising:

a high-side circuit region;

a low-side circuit region; and a reduced surface field (RESURF) isolation structure surrounding an outer periphery of the high-side circuit region to isolate the high-side circuit region and the low-side circuit region from each other, wherein the RESURF isolation structure includes a high-voltage isolation region, a high-voltage n-channel metal-oxide semiconductor (N-ch MOS), and a high-voltage p-channel metal-oxide semiconductor (P-ch MOS), the high-voltage isolation region, the high-voltage N-ch MOS, and the high-voltage P-ch MOS include a thermal oxide film, and a plurality of field plates provided on the thermal oxide film, and a field plate located closest to the low-side circuit region in the high-voltage P-ch MOS is shorter than a field plate located closest to the low-side circuit region in the high-voltage N-ch MOS.

* * * * *